(12) United States Patent
Park et al.

(10) Patent No.: US 10,580,364 B2
(45) Date of Patent: Mar. 3, 2020

(54) COLOR CONVERSION PANEL AND DISPLAY DEVICE INCLUDING THE SAME

(71) Applicant: Samsung Display Co., Ltd., Yongin-si, Gyeonggi-do (KR)

(72) Inventors: Kyoung Won Park, Seoul (KR); Min Ki Nam, Anseong-si (KR); Seon-Tae Yoon, Seoul (KR); Baek Hee Lee, Yongin-si (KR); Young Min Kim, Asan-si (KR); Hae Il Park, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 252 days.

(21) Appl. No.: 15/678,977

(22) Filed: Aug. 16, 2017

(65) Prior Publication Data
US 2018/0108303 A1   Apr. 19, 2018

(30) Foreign Application Priority Data

Oct. 17, 2016   (KR) .................. 10-2016-0134509

(51) Int. Cl.
   *G09G 3/34*       (2006.01)
   *G02F 1/23*       (2006.01)
   *H01L 27/32*      (2006.01)
   *B82Y 20/00*      (2011.01)

(52) U.S. Cl.
   CPC ............ *G09G 3/3413* (2013.01); *G02F 1/23* (2013.01); *H01L 27/322* (2013.01); *B82Y 20/00* (2013.01); *G09G 2340/06* (2013.01); *H01L 2251/5369* (2013.01); *Y10T 428/24802* (2015.01); *Y10T 428/24876* (2015.01)

(58) Field of Classification Search
   CPC .......... H01L 27/322; Y10T 428/24802; Y10T 428/24876
   See application file for complete search history.

(56) References Cited

U.S. PATENT DOCUMENTS

| | | | |
|---|---|---|---|
| 2010/0129598 A1* | 5/2010 | Su ..................... | H01L 33/504 428/116 |
| 2013/0242228 A1* | 9/2013 | Park .................. | G02F 1/133617 349/61 |
| 2015/0036379 A1* | 2/2015 | Lee ................... | G02F 1/133617 362/606 |
| 2016/0011506 A1 | 1/2016 | Gu et al. | |
| 2016/0223732 A1* | 8/2016 | Jeon ................. | G02F 1/133609 |

FOREIGN PATENT DOCUMENTS

| | | |
|---|---|---|
| KR | 10-0982992 B1 | 9/2010 |
| KR | 10-2016-0025142 A | 3/2016 |
| KR | 10-2016-0056493 A | 5/2016 |

* cited by examiner

*Primary Examiner* — Gerard Higgins
(74) *Attorney, Agent, or Firm* — Innovation Counsel LLP

(57) ABSTRACT

A color conversion panel according to an exemplary embodiment includes: a substrate; and a plurality of color conversion layers and a transmission layer that are disposed on the substrate, the plurality of color conversion layers including nanocrystals, wherein at least one color conversion layer of the plurality of color conversion layers includes a first color conversion layer and a second color conversion layer, the first color conversion layer is disposed between the substrate and the second color conversion layer, and the first and second color conversion layers are configured so that a wavelength of light color-converted in the first color conversion layer is shorter than a wavelength of light color-converted in the second color conversion layer.

18 Claims, 11 Drawing Sheets

COLOR CONVERSION PANEL AND DISPLAY DEVICE INCLUDING THE SAME

CROSS-REFERENCE TO RELATED APPLICATION

This application claims priority to, and the benefit of, Korean Patent Application No. 10-2016-0134509 filed in the Korean Intellectual Property Office on Oct. 17, 2016, the entire contents of which are incorporated herein by reference.

BACKGROUND

(a) Technical Field

The present disclosure relates generally to display devices. More specifically, the present disclosure relates to color conversion panels and display devices including the same.

(b) Description of the Related Art

A liquid crystal display used as a display device includes two field generation electrodes, a liquid crystal layer, a color filter, and a polarizer. Light loss occurs in the polarizer and the color filter of the liquid crystal display. Accordingly, a liquid crystal display that includes a color conversion layer has been proposed to implement a highly effective display device while reducing light loss.

The above information disclosed in this Background section is only for enhancement of understanding of the background of the invention and therefore it may contain information that does not form the prior art that is already known in this country to a person of ordinary skill in the art.

SUMMARY

The present invention provides a color conversion panel with improved light conversion efficiency, and a display device including the same.

A color conversion panel according to an exemplary embodiment includes: a substrate; and a plurality of color conversion layers and a transmission layer that are disposed on the substrate, the plurality of color conversion layers including nanocrystals, wherein at least one color conversion layer of the plurality of color conversion layers includes a first color conversion layer and a second color conversion layer, the first color conversion layer is disposed between the substrate and the second color conversion layer, and the first and second color conversion layers are configured so that a wavelength of light color-converted in the first color conversion layer is shorter than a wavelength of light color-converted in the second color conversion layer.

The size of a first nanocrystal included in the first color conversion layer may be smaller than the size of a second nanocrystal included in the second color conversion layer.

The size of a first nanocrystal included in the first color conversion layer may be 70% to 100% of the size of a second nanocrystal included in the second color conversion layer.

The size of the first nanocrystal may be 2 nm to 14 nm, and the size of the second nanocrystal may be 4 nm to 16 nm.

The first color conversion layer may include first nanocrystals, the second color conversion layer may include second nanocrystals, and the first nanocrystal comprises the same material as the second nanocrystal.

The first color conversion layer may include first nanocrystals, the second color conversion layer may include second nanocrystals, and first nanocrystal comprises different materials from those of the second nanocrystal.

The first color conversion layer and the second color conversion layer may be green color conversion layers, the wavelength of light color-converted in the first color conversion layer may be 520 nm to 539 nm, and the wavelength of light color-converted in the second color conversion layer may be 540 nm to 550 nm.

The first color conversion layer and the second color conversion layer may be red conversion layers, the wavelength of light color-converted in the first color conversion layer may be 610 nm to 629 nm, and the wavelength of light color-converted in the second color conversion layer may be 630 nm to 650 nm.

The plurality of color conversion layers may include a green color conversion layer and a red color conversion layer, the green color conversion layer may include a first green color conversion layer and a second green color conversion layer, the first and second green color conversion layers may be configured so that a wavelength of light color-converted in the first green color conversion layer may be shorter than a wavelength of light color-converted in the second green color conversion layer, the red color conversion layer may include a first red color conversion layer and a second red color conversion layer, and the first and second red color conversion layers may be configured so that a wavelength of light color-converted in the first red color conversion layer may be shorter than a wavelength of light color-converted in the second red color conversion layer.

The first color conversion layer may be a green color conversion layer, the second color conversion layer is a red color conversion layer, and the color conversion panel may further include a color filter that is disposed between the first color conversion layer and the substrate.

The color conversion panel may further include a color filter that is disposed between the plurality of color conversion layers and the substrate.

A display device according to an exemplary embodiment may include: a display panel; and a color conversion panel that is disposed on the display panel, wherein the color conversion panel includes a substrate, and a plurality of color conversion layers and a transmission layer that are disposed between the substrate and the display panel, the plurality of color conversion layers including nanocrystals, at least one color conversion layer of the plurality of color conversion layers includes a first color conversion layer and a second color conversion layer, the first color conversion layer is disposed between the substrate and the second color conversion layer, and the first and second color conversion layers are configured so that a wavelength of light color-converted in the first color conversion layer is shorter than a wavelength of light color-converted in the second color conversion layer.

The size of a first nanocrystal included in the first color conversion layer may be smaller than the size of a second nanocrystal included in the second color conversion layer.

The first color conversion layer and the second color conversion layer may be green color conversion layers, the wavelength of light color-converted in the first color conversion layer may be 520 nm to 539 nm, and the wavelength of light color-converted in the second color conversion layer may be 540 nm to 550 nm.

The first color conversion layer and the second color conversion layer may be red color conversion layers, the wavelength of light color-converted in the first color conversion layer may be 610 nm to 629 nm, and the wavelength of light color-converted in the second color conversion layer may be 630 nm to 650 nm.

The plurality of color conversion layers may include a green color conversion layer and a red color conversion layer, the green color conversion layer may include a first green color conversion layer and a second green color conversion layer, the first and second green color conversion layers may be configured so that a wavelength of light color-converted in the first green color conversion layer may be shorter than a wavelength of light color-converted in the second green color conversion layer, the red color conversion layer may include a first red color conversion layer and a second red color conversion layer, and the first and second green color conversion layers may be configured so that a wavelength of light color-converted in the first red color conversion layer may be shorter than a wavelength of light color-converted in the second red color conversion layer.

The first color conversion layer may be a green color conversion layer, the second color conversion layer may be a red color conversion layer, and the display device may further include a color filter that is disposed between the first color conversion layer and the substrate.

The display panel may include: a first substrate; a roof layer that overlaps the first substrate; and a plurality of microcavities that are disposed between the first substrate and the roof layer and that include liquid crystal molecules.

The roof layer may include a protrusion that extends toward the first substrate, and the protrusion may be disposed between two of the microcavities.

The display panel may include: a first substrate that includes a first electrode; a second substrate that overlaps the first substrate and includes a second electrode; and a liquid crystal layer that is disposed between the first substrate and the second substrate.

According to exemplary embodiments, a color conversion panel having improved light conversion efficiency, and a display device including the same can be provided.

DETAILED DESCRIPTION OF THE EMBODIMENTS

Figure 1:
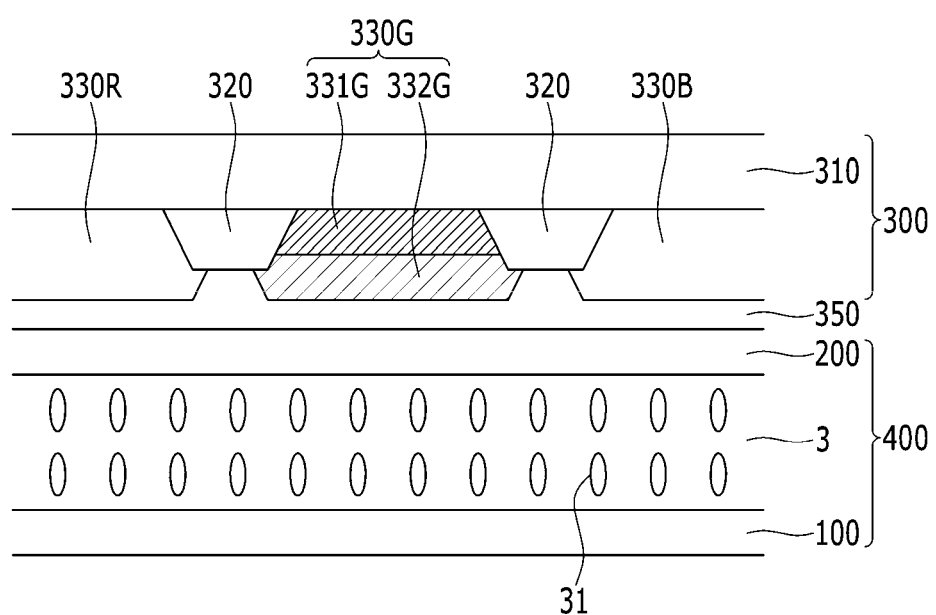
FIG. 1 is a schematic cross-sectional view of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity. The various drawings are thus not to scale.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrases "on a plane" or "in plan view" mean viewing a target portion from the top, and the phrase "on a cross-section" means viewing a cross-section formed by vertically cutting a target portion from the side.

All numerical values are approximate, and may vary. All examples of specific materials and compositions are to be taken as nonlimiting and exemplary only. Other suitable materials and compositions may be used instead.

Hereinafter, a display device according to an exemplary embodiment will be described with reference to FIG. 1. FIG. 1 is a cross-sectional view of a display device according to an exemplary embodiment.

Referring to FIG. 1, a display device according to an exemplary embodiment includes a display panel 400 and a color conversion panel 300. The display panel 400 may include a first display panel 100, a second display panel 200 that overlaps the first display panel 100, and a liquid crystal layer 3 that is disposed between the first display panel 100 and the second display panel 200 and that includes liquid crystal molecules 31. However, such a structure of the display panel 400 is an exemplary structure, and the display panel 400 may for example include only one substrate. Alternatively, the display panel 400 may be a light emitting display device that does not include liquid crystals.

The color conversion panel 300 includes a substrate 310, color conversion layers 330R and 330G, a transmission layer 330B, a light blocking layer 320, and a planarization layer 350. The color conversion layers 330R and 330G of the color conversion panel 300 convert incident blue light to light of a red or green color, and the transmission layer 330B simply transmits incident blue light.

Referring to FIG. 1, the green convention layer 330 G according to the present exemplary embodiment includes a first green color conversion layer 331G and a second green color conversion layer 332G.

A wavelength of green light, that appears after color conversion in the first green color conversion layer 331G, is shorter than a wavelength of green light that appears after color conversion in the second green color conversion layer 332G. For example, the second green color conversion layer 332G may convert incident blue light to green light having a wavelength of 540 nm to 550 nm, and the first green color conversion layer 331G may convert incident blue light to green light having a wavelength of 520 nm to 539 nm.

The first green color conversion layer 331G, that converts incident light to green light having a shorter wavelength, is disposed closer to the substrate 310 than the second green color conversion layer 332G that converts incident light to green light having a relatively longer wavelength. That is, the first green color conversion layer 331G is disposed between the substrate 310 and the second green color conversion layer 332G.

Thus, blue light incident on the display panel 400 is transmitted through the second green color conversion layer 332G and is then incident on the first green color conversion layer 331G.

When the green color conversion layer 330G has a double-layer structure and thus incident light is converted to green lights each having a different wavelength, light color-converted to green in the green color conversion layer 330G can be prevented from being reabsorbed in the color conversion layer 330G, thereby improving color conversion efficiency.

That is, when the green color conversion layer 330G is disposed as a single layer, the color converted green light is partially absorbed again while being transmitted through the green color conversion layer 330G, so that color conversion efficiency may be deteriorated. The green color conversion layer 330G converts incident blue light to green light, and conversion efficiency at this time is referred to as color conversion efficiency.

However, in the display device according to the present exemplary embodiment, light passed through the second green color conversion layer 332G is incident on the first green color conversion layer 331G, and the first green color conversion layer 331G emits green light having a lower wavelength range so that the green light emitted from the second green color conversion layer 332G can be prevented from being absorbed in the first green color conversion layer 331G. This is because an absorption spectrum of the first green color conversion layer 331G moves toward a lower wavelength compared to an absorption spectrum of the second green color conversion layer 332G, and accordingly, absorption with respect to light having a wavelength range emitted from the second green color conversion layer 332G is reduced.

Although not illustrated in FIG. 1, a color filter may further be disposed between the green color conversion layer 330G and the substrate 310. When a green color filter is further included, light of a wavelength at which color conversion to green does not occur in the green color conversion layer 330G is blocked, thereby emitting high purity green light.

In the display device according to the exemplary embodiment of FIG. 1, the green color conversion layer 330G may be manufactured by coating the first green color conversion layer 331G on the substrate 310, heating the same for a constant time period, and then coating the second green color conversion layer 332G thereon. However, such a manufacturing method is an example, and the present invention is not limited thereto.

Figure 2:
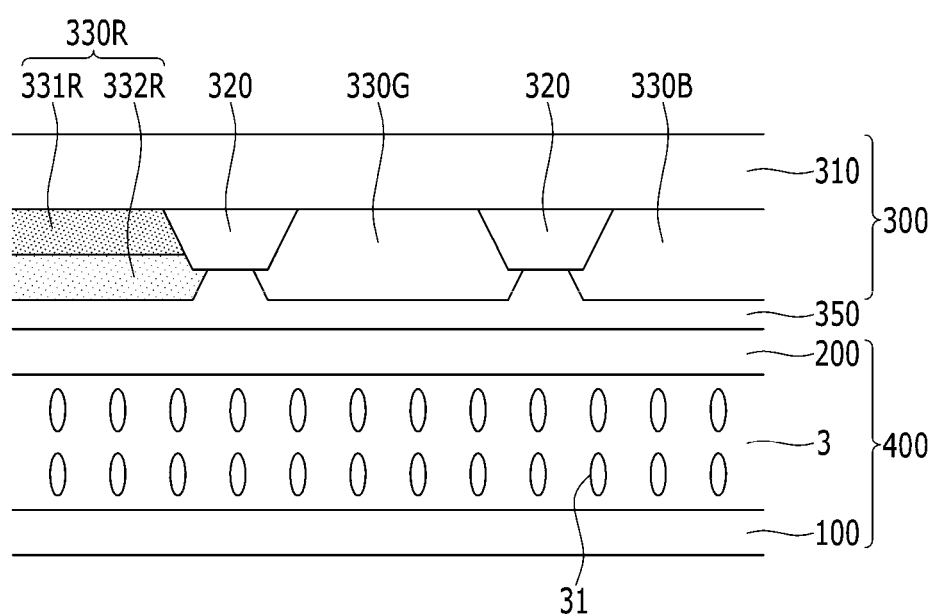
FIG. 2 is a schematic cross-sectional view of a display device according to another exemplary embodiment.

In addition, a display device according to another exemplary embodiment may include a first red color conversion layer 331R and a second red color conversion layer 332R that emit red light of different wavelength ranges. FIG. 2 is a schematic cross-sectional view of a display device according to the other exemplary embodiment. Referring to FIG. 2, the display device according to the other exemplary embodiment includes the red color conversion layer 330R which includes the first red color conversion layer 331R and the second red color conversion layer 332R, and a wavelength of the red light emitted from the first red color conversion layer 331R is shorter than a wavelength of the red light emitted from the second red color conversion layer 332R. Thus, as in the exemplary embodiment of FIG. 1, absorption of red light in the red color conversion layer 330R can be prevented, thereby improving color conversion efficiency.

Figure 3:
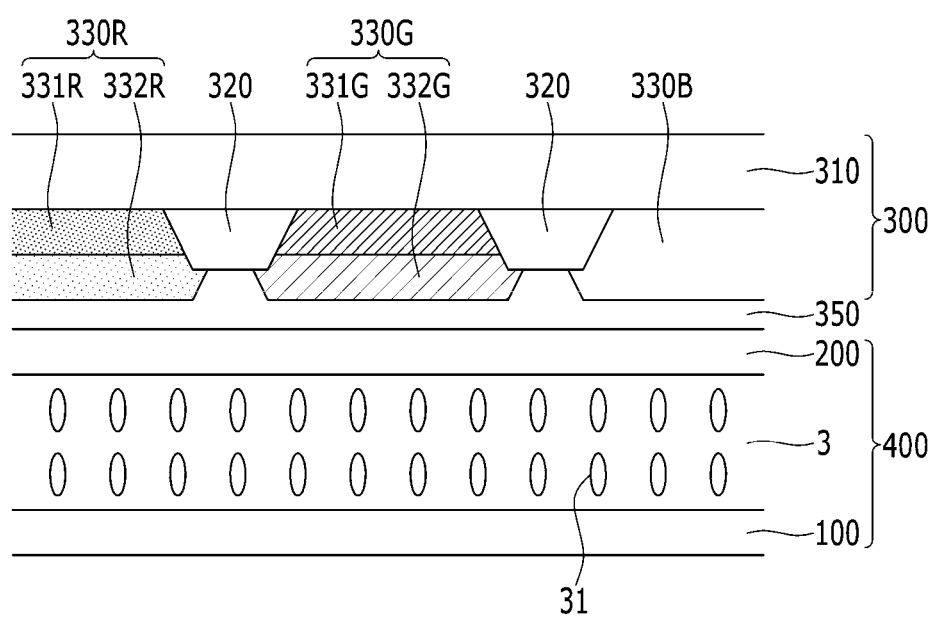
FIG. 3 is a schematic cross-sectional view of a display device according to still another exemplary embodiment.

FIG. 3 is a schematic cross-sectional view of a display device according to another exemplary embodiment. Referring to FIG. 3, in a display device according to the present exemplary embodiment, a green color conversion layer 330G includes a first green color conversion layer 331G and a second green color conversion layer 332G, and a wavelength of green light converted in the first green color conversion layer 331G is shorter than a wavelength of green light converted in the second green color conversion layer 332G. In addition, a red conversion layer 330R includes a first red conversion layer 331R and a second red conversion layer 332R, and a wavelength of red light converted in the first red conversion layer 331R is shorter than a wavelength of red light converted in the second red conversion layer 332R. Thus, the display device according to the exemplary embodiment of FIG. 3 can improve color conversion efficiency by preventing reabsorption of both green light and red light.

Figure 4:
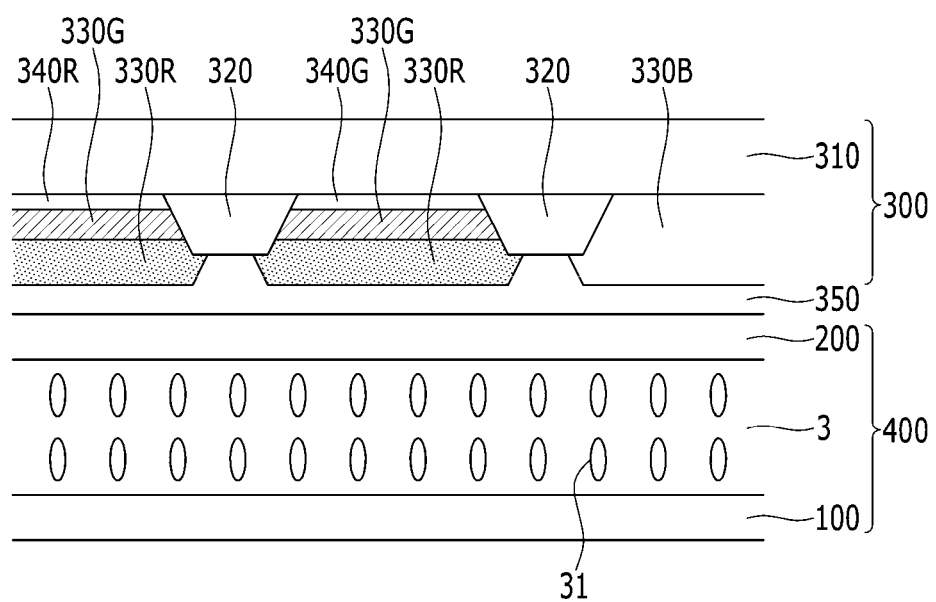
FIG. 4 is a schematic cross-sectional view of a display device according to still another exemplary embodiment.

FIG. 4 is a cross-sectional view of a display device according to another exemplary embodiment. Referring to FIG. 4, in a display device according to the present exemplary embodiment, a green color conversion layer 330G and a red conversion layer 330R are disposed overlapping each other. That is, the red color conversion layer 330R is disposed close to a substrate 310 commonly in a green area and a red area, and the red color conversion layer 330R is disposed in contact with the green color conversion layer 330G.

However, a green color filter 340G is disposed between the green color conversion layer 330G and the substrate 310 in the green area, and a red color filter 340R is disposed between the green color conversion layer 330G and the substrate 310 in the red area. Thus, only green light color-converted in the green color conversion layer 330G passes through the green color filter 340G, and red light color-converted in the red color conversion layer 330R cannot pass through the green color filter 340G in the green area. In addition, only red light color-converted in the red conversion layer 330R passes through the red color filter 340R and green light color-converted in the green color conversion layer 330G cannot pass through the red color filter 340R in the red area. In the exemplary embodiment of FIG. 4, the color conversion layer also has a double-layered structure, and the green color conversion layer 330G that is disposed close to the substrate 310 color-converts incident light into light having a shorter wavelength than that of the red color conversion layer 330R. Thus, light color-converted in the red conversion layer 330R is not absorbed in the green color conversion layer 330G. In addition, since color conversion layers stacked in the green area and the red area are the same, the color conversion layers in the green area and the red area can be formed through a single process, thereby simplifying their manufacturing process.

As described, the display devices of FIG. 1 to FIG. 4 include color conversion panels 300, and the green color conversion layer 330G and/or the red color conversion layer 330R includes a double-layered structure, each layer emitting light of a different wavelength. Thus, deterioration of color conversion efficiency due to reabsorption of light color-converted in the color conversion layer can be prevented, thereby improving color conversion efficiency.

In this case, a wavelength of light color-converted in the color conversion layer can be adjusted by varying the size of nanocrystals included in the color conversion layer. The nanocrystal is a material that converts a color in the color conversion layer, and may include quantum dots or quantum rods. Hereinafter, the nanocrystal included in the color conversion layer is exemplarily described as a quantum dot, but this is not restrictive. The nanocrystals of the color conversion layer may include only either quantum dots or quantum rods, but this is also not restrictive. The nanocrystals of the color conversion layer may include both quantum dots and quantum rods.

Figure 5:
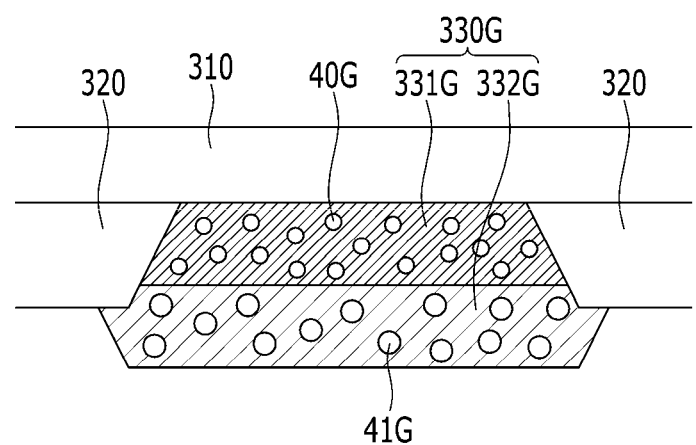
FIG. 5 shows details of a green color conversion layer.

FIG. 5 shows the green color conversion layer 330G. Referring to FIG. 5, the first green color conversion layer 331G includes first green quantum dots 40G, and the second green color conversion layer 332G includes second green quantum dots 41G.

Referring to FIG. 5, the size of the first green quantum dot 40G is smaller than the size of the second green quantum dot 41G. More specifically, the size (as measured by any characteristic dimension, such as volume or diameter) of the first green quantum dot 40G may be about 2 nm to 14 nm, and the size (as measured by any characteristic dimension, such as volume or diameter) of the second green quantum dot 41G may be about 4 nm to 16 nm. In addition, a size difference between the first green quantum dot 40G and the second green quantum dot 41G may be about 70% to 100%. That is, the first green quantum dot 40G is about 70% to 100% of the size of the second green quantum dot 41G.

When the size of the quantum dot is reduced, an energy band gap of a quantum material may be increased by a quantum confinement effect. Such a quantum confinement effect is increased as the size of the quantum dot is increased. Thus, an energy band gap of the smaller first green quantum dot 40G is lower than an energy band gap of the larger second green quantum dot 41G, and accordingly, a wavelength of light color-converted in the first green color conversion layer 331G becomes shorter.

When the quantum dot has a core/shell structure, a core diameter of the first green quantum dot 40G may be smaller than a core diameter of the second green quantum dot 41G. This is because color conversion substantially occurs in a core of the core/shell structure, and thus the quantum confinement effect is increased as the size of the core is decreased.

However, the first green quantum dot 40G and the second green quantum dot 41G may be the same material or may be different materials. When the first green quantum dot 40G and the second green quantum dot 41G are the same material, the size of the first green quantum dot 40G should be smaller than the size of the second green quantum dot 41G, but when the first green quantum dot 40G and the second green quantum dot 41G are different materials, the size of the first green quantum dot 40G may be equal to the size of the second green quantum dot 41G or the size of the second green quantum dot 41G may be greater than the size of the first green quantum dot 40G. In this case, the first green quantum dot 40G may include a material that has a higher energy band gap compared to that of the second green quantum dot 41G.

As previously described, when the color conversion layer is disposed as a double-layered structure and thus incident light is color-converted to lights each having a different wavelength, reabsorption of light color-converted in the color conversion layer can be prevented, thereby improving color conversion efficiency.

Figure 6:
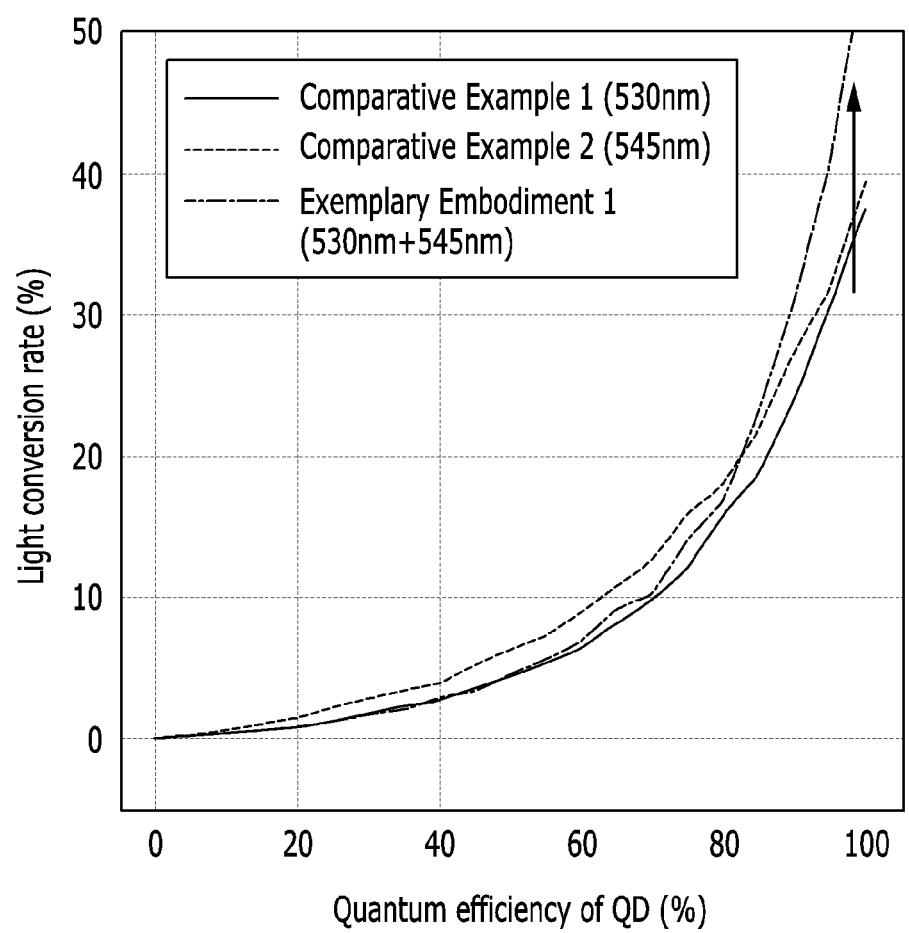
FIG. 6 shows measurements of a light conversion ratio according to quantum efficiency with respect to color conversion layers, according to a comparative example and an exemplary embodiment.

FIG. 6 is a graph that illustrates measurements of light conversion rates according to quantum efficiency with respect to color conversion layers, each color-converting with a single wavelength according to Comparative Example 1 and Comparative Example 2, and a color conversion layer having a multi-layer structure of Exemplary Embodiment 1, in which light is color-converted to lights of different wavelengths as in the present disclosure.

Comparative Example 1 is a color conversion layer that color-converts incident light to light having a wavelength of 530 nm, Comparative Example 2 is a color conversion layer that color-converts incident light to light having a wavelength of 545 nm, and Exemplary Embodiment 1 is a color conversion layer formed by stacking a second layer that converts incident light to light having a wavelength of 545 nm on a first layer that color-converts incident light to light having a wavelength of 530 nm.

Referring to FIG. 6, when the quantum efficiency is 85% or more, the color conversion layer of Exemplary Embodiment 1 has a relatively high light conversion rate. In addition, as the quantum efficiency approaches 100%, a difference in light conversion rate between Comparative Examples 1 and 2 and Exemplary Embodiment 1 is increased. This is because, as described above, the multi-layer color conversion layers emit light of different wavelengths to minimize the self-reabsorption of the light converted in the color conversion layer.

Table 1 shows light conversion rates according to quantum efficiency in a partial area of FIG. 6.

TABLE 1

| | Light conversion rate (%) | | |
|---|---|---|---|
| | Quantum Efficiency 85% | Quantum Efficiency 90% | Quantum Efficiency 95% |
| Comparative Example 1 (530 nm) | 20 | 25 | 30 |
| Comparative Example 2 (545 nm) | 22 | 27 | 32 |
| Exemplary Embodiment 1 (530 nm + 545 nm) | 24 | 32 | 43 |

As shown in Table 1, Exemplary Embodiment 1, which is the double-layered color conversion layer, has a higher light conversion rate for the same quantum efficiency, as compared to Comparative Examples 1 and 2.

Hereinafter, a display device including the above-described color conversion panel will be described in more detail with reference to the drawings. However, the present embodiment is merely an example of the display device, and is not limited to the structure described in this embodiment. That is, the present invention includes a double-layer structure in which the color conversion layer converts light into a color having different wavelengths, and as long as a color conversion panel having a structure in which a wavelength of light converted in the color conversion layer that is disposed on the side closer to the user's eye is shorter than a wavelength of light converted in the color conversion layer that is disposed farther from the user's eye is included, the display device is applicable to display devices of various structures.

Figure 7:
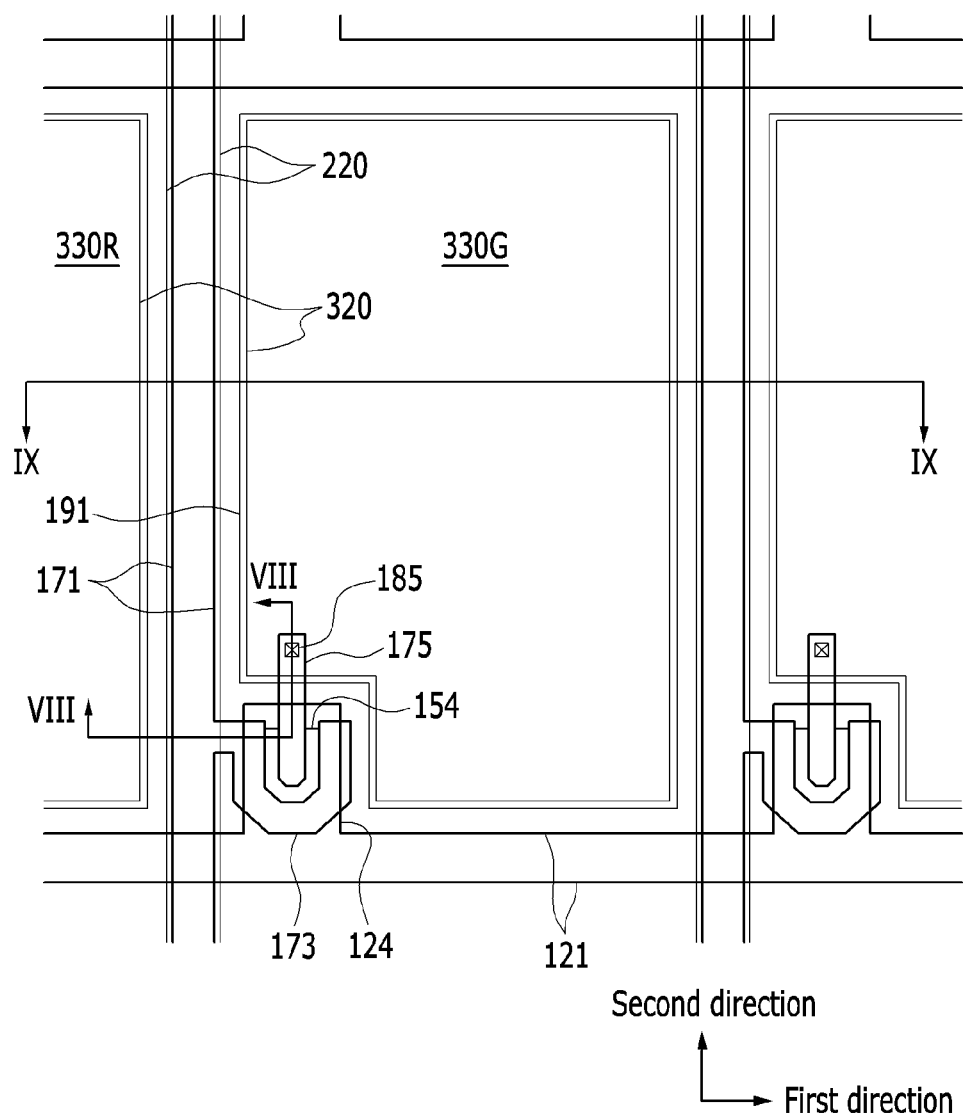
FIG. 7 is a layout view of a display device according to an exemplary embodiment.
Figure 8:
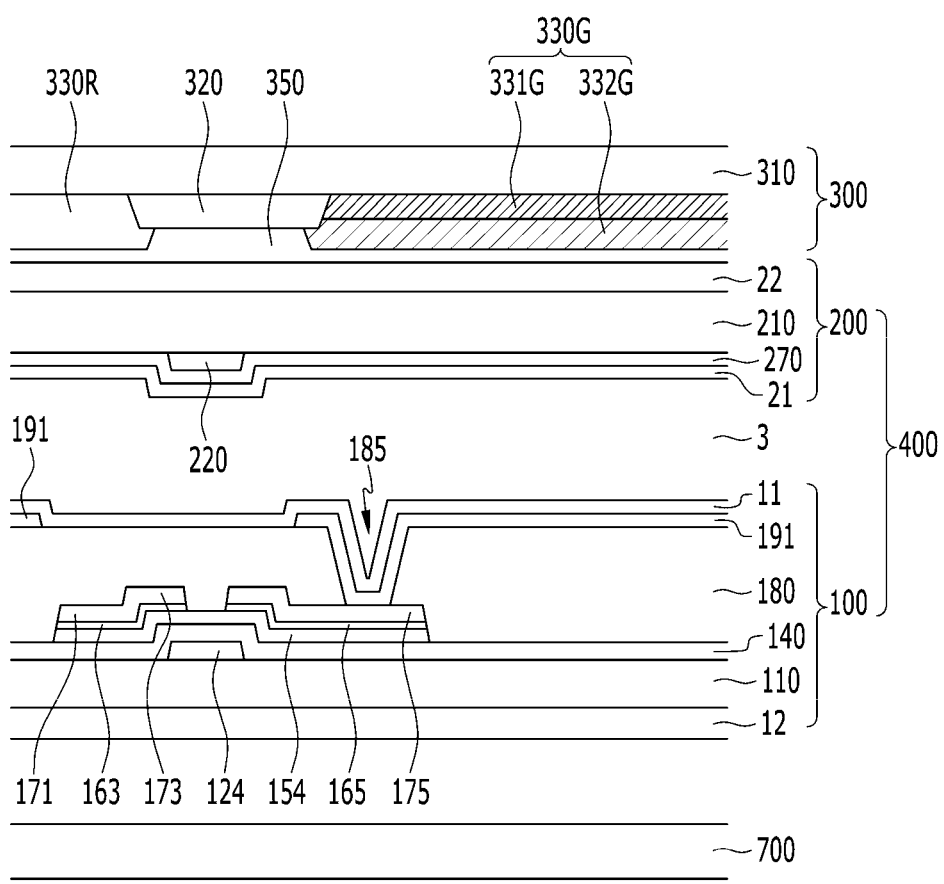
FIG. 8 is a cross-sectional view of FIG. 7, taken along the line VIII-VIII.
Figure 9:
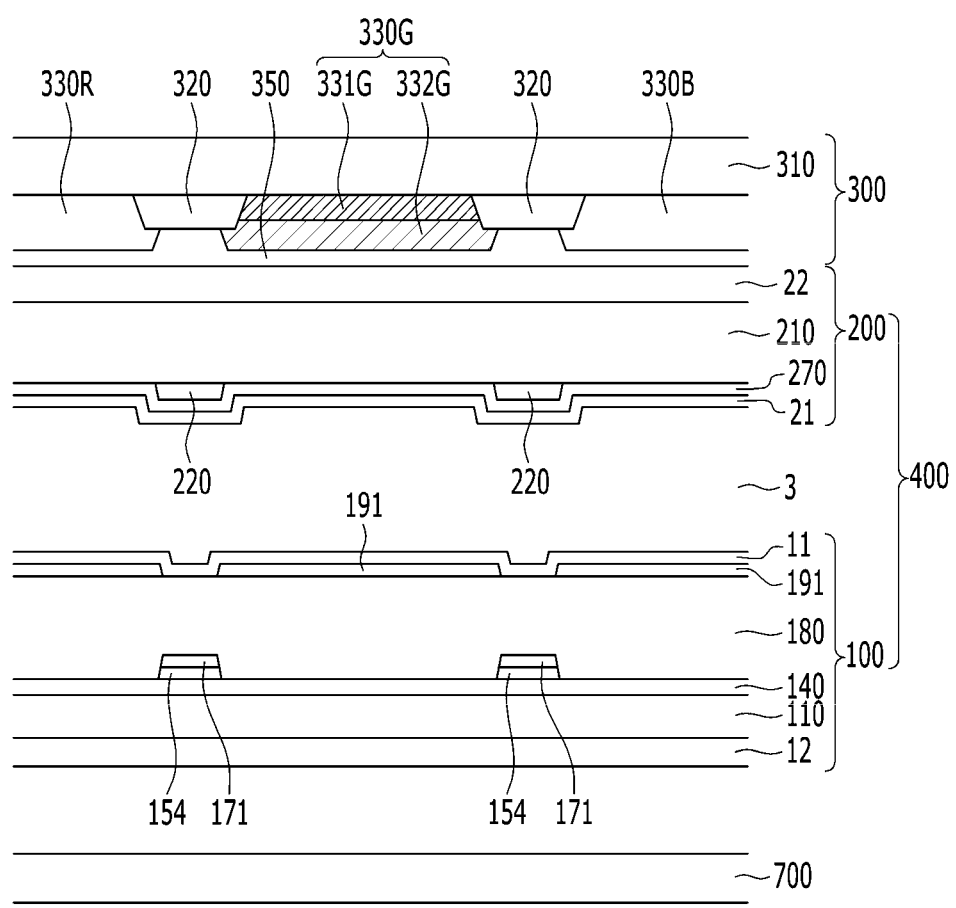
FIG. 9 is a cross-sectional view of FIG. 7, taken along the line IX-IX.

FIG. 7 is a layout view of a display device according to an exemplary embodiment, FIG. 8 is a cross-sectional view of FIG. 7 taken along the line VIII-VIII, and FIG. 9 is a cross-sectional view of FIG. 7 taken along the line IX-IX.

Referring to FIG. 7 to FIG. 9, a display device according to the present exemplary embodiment includes a display panel 400 and a color conversion panel 300. In addition, the display device includes a light unit 700 that supplies light to the display panel 400 and the color conversion panel 300. The light unit 700 supplies blue light, and may include a blue light emitting diode. Light emitted from the light unit 700 is sequentially passed through the display panel 400 and the color conversion panel 300, and then emitted.

First, the display panel 400 includes a first display panel 100, a second display panel 200 that overlaps the first display panel 100, and a liquid crystal layer 3 that is disposed between the first display panel 100 and the second display panel 200.

The first display panel 100 will now be described. A gate conductor that includes a gate line 121 and a gate electrode 124 is disposed on one side of a first substrate 110 that is made of transparent glass or plastic, and a first polarization layer 12 is disposed on the other side of the first substrate 110.

The gate line 121 may extend in a first direction. The gate conductor may include various metals or conductors, and may have a multilayer structure. A gate insulation layer 140 is disposed between the gate conductor and the liquid crystal layer 3. The gate insulating layer 140 may include an inorganic insulation material.

A semiconductor layer 154 is disposed on the gate insulating layer 140.

A data line 171 is disposed between the semiconductor layer 154 and the liquid crystal layer 3, and extends in a second direction and thus crosses the gate line 121. A source electrode 173 extends from the data line 171 and may overlap the gate electrode 124. A drain electrode 175 is separated from the data line 171, and as shown in FIG. 7, may have the shape of a bar that is extended toward a center of the source electrode 173.

A part of the semiconductor layer 154 may not overlap the data line 171 and the drain electrode 175 in an area between the source electrode 173 and the drain electrode 175. Except for such a non-overlapped portion, the semiconductor layer 154 may have a shape in plan view that is substantially the same as the data line 171 and the drain electrode 175.

One gate electrode 124, one source electrode 173, and one drain electrode 175 form a single thin film transistor together with the semiconductor layer 154, and a channel of the thin film transistor is an area of the semiconductor layer 154 between the source electrode 173 and the drain electrode 175.

A passivation layer 180 is disposed between the source electrode 173, the drain electrode 175, and the liquid crystal layer 3. The passivation layer 180 may include an inorganic insulation material such as a silicon nitride or a silicon oxide, an organic insulation material, a low-dielectric insulation material, and the like.

The passivation layer 180 has a contact hole 185 that partially overlaps the drain electrode 175.

A first electrode 191 is disposed between the passivation layer 180 and the liquid crystal layer 3. The first electrode 191 is physically and electrically connected with the drain electrode 175 through the contact hole 185, and receives a data voltage from the drain electrode 175. The first electrode 191 may be a pixel electrode.

A first alignment layer 11 is disposed between the first electrode 191 and the liquid crystal layer 3.

The second display panel 200 includes a second substrate 210, a light blocking member 220, a second electrode 270, a second alignment layer 21, and a second polarization layer 22.

The second polarization layer 22 is disposed on one side of the second substrate 210, and the second electrode 270 is disposed on the other side of the second substrate 210. The second electrode 270 may be a common electrode.

The second polarization layer 22 includes a plurality of microlines that are arranged at constant intervals, and the plurality of microlines may include a metal. However, this is not restrictive, and the polarization layer 22 may instead be disposed as a coating type of polarization layer.

The light blocking member 220 is disposed between the second substrate 210 and the second electrode 270. The light blocking member 220 may extend in the second direction while overlapping the data line 171. Although it is not illustrated, the light blocking member 220 may further include a stripe that extends in the first direction while overlapping the gate line 121.

The second alignment layer 21 is disposed between the second electrode 270 and the liquid crystal layer 3.

The color conversion panel 300 will now be described. The color conversion panel 300 includes a substrate 310, color conversion layers 330R and 330G, a transmission layer 330B, a light blocking layer 320, and a planarization layer 350.

The light blocking layer 320 is disposed between the substrate 310 and the display panel 400. The light blocking layer 320 is disposed overlapping the light blocking member 220, and thus may extend along the second direction. Alternatively, referring to FIG. 7, the light blocking layer 320 may extend along the first direction while overlapping the gate line 121 and the thin film transistor.

In other words, the light blocking layer 320 may be formed in the shape of a lattice that includes a stripe that extends along the first direction and a vertical portion extending along the second direction. However, this is but an example, and the light blocking layer 320 may include only a vertical portion that extends along the second direction. In this case, the gate line 121 and the thin film transistor may overlap the light blocking member 220 of the display panel 400, and may be light-blocked by the light blocking member 220.

The green color conversion layer 330G, the red conversion layer 330R, and the transmission layer 330B are disposed between the substrate 310 and the display panel 400.

The green color conversion layer 330G and the red conversion layer 330R are the same as those described above. That is, the color conversion layers 330R and 330G may each have one of structures of exemplary embodiments of FIG. 1 to FIG. 4. A detailed description of the same constituent elements is thus omitted.

In this case, quantum dots included in the color conversion layers 330R and 330G may be selected from a group II-VI compound, a group IV-VI compound, a group IV element, a group IV compound, and any combination thereof.

The group II-VI compound may be selected from: a group of two-element compounds selected from CdSe, CdTe, ZnS, ZnSe, ZnTe, ZnO, HgS, HgSe, HgTe, MgSe, MgS, and a mixture thereof; a group of three-element compounds selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a group of four-element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. A group III-V compound may be selected from: a group of two-element compounds selected from GaN, GaP, GaAs, GaSb, AN, AlP, AlAs, AlSb, InN, InP, InAs, InSb, and a mixture thereof; a group of three-element compounds selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a group of four-element compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group IV-VI compound may be selected from: a group of two-element compounds selected from SnS, SnSe, SnTe, PbS, PbSe, PbTe, and a mixture thereof; a group of three-element compounds selected from SnSeS, SnSeTe, SnSTe, PbSeS, PbSeTe, PbSTe, SnPbS, SnPbSe, SnPbTe, and a mixture thereof; and a group of four-element compounds selected from SnPbSSe, SnPbSeTe, SnPbSTe, and a mixture thereof. The group IV element may be selected from a group of Si, Ge, and a mixture thereof. The group IV compound may be a binary compound selected from a group of SiC, SiGe, and a mixture thereof.

In this case, the binary compound, the tertiary compound, or the quaternary compound may exist in particles at a substantially uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced nearing the center thereof.

Further, a form of the quantum dot may be any form generally used or to be used in the art and is not particularly limited, but more specifically, it is preferable to use forms such as spherical, pyramidal, multi-arm-shaped, or cubic nanoparticles, nanotubes, nanowires, nanofibers, and nano-plate-shaped particles.

The planarization layer 350 is disposed between the green color conversion layer 330G, the red conversion layer 330R, the transmission layer 330B, and the display panel 400. The planarization layer 350 fills spaces between the red conversion layer 330R, the green color conversion layer 330G, and the transmission layer 330B, and provides a flat surface.

However, this display device is only an example, and the display device of the present invention is not limited to the structure shown in FIG. 7 to FIG. 9.

Next, a display device according to another exemplary embodiment of the present invention will be described with reference to FIG. 10 and FIG. 11.

Figure 10:
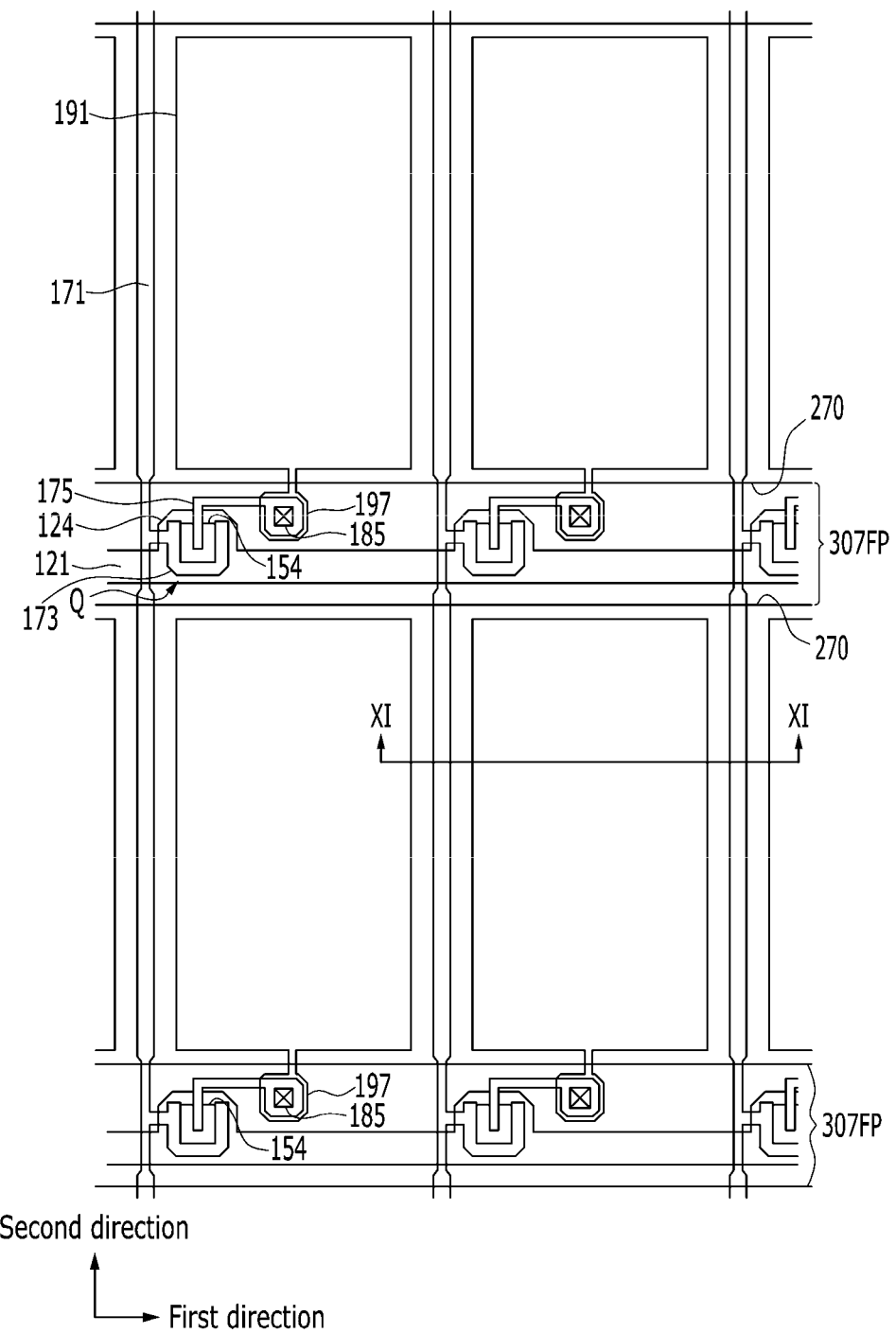
FIG. 10 is a top plan view of the display device according to the exemplary embodiment.
Figure 11:
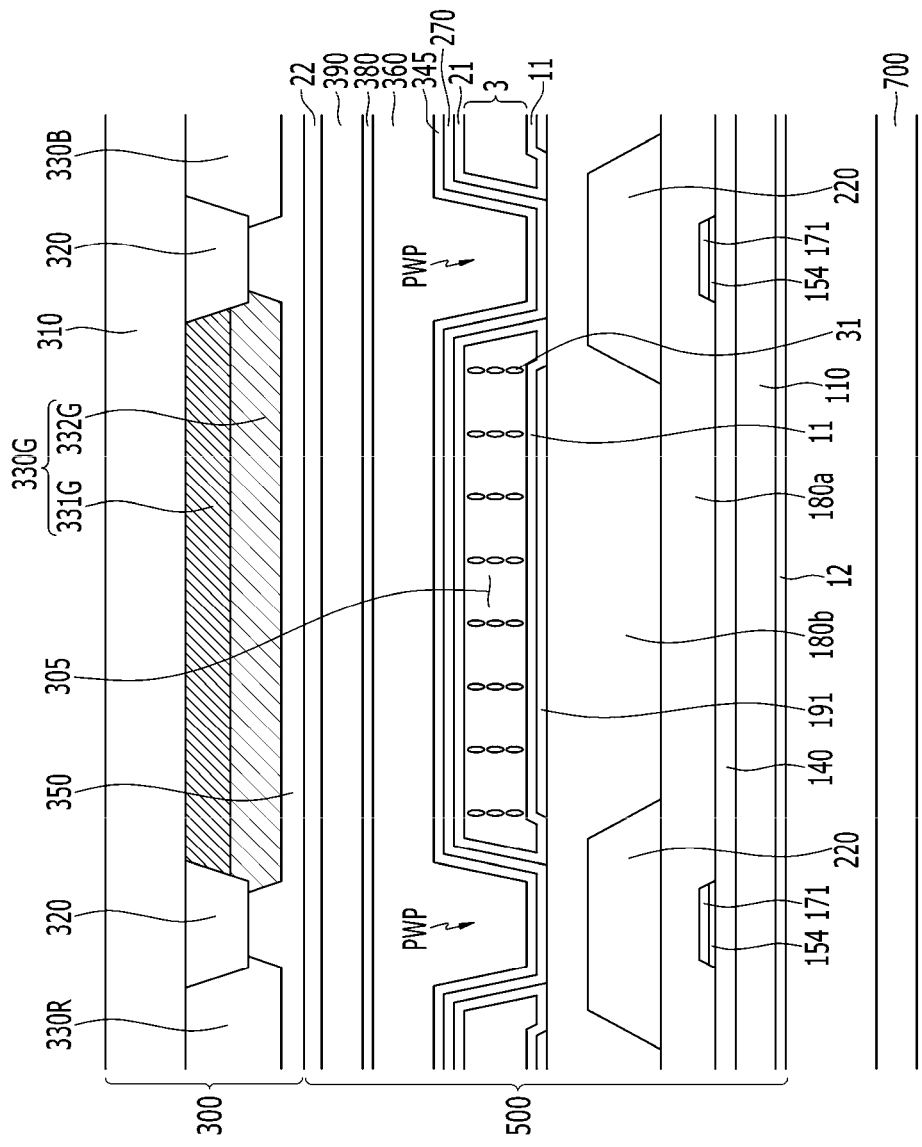
FIG. 11 is a cross-sectional view of FIG. 10, taken along the line XI-XI.

FIG. 10 is a top plan view of a display device according to an exemplary embodiment, and FIG. 11 is a cross-sectional view of FIG. 10, taken along the line XI-XI. The display device according to the present exemplary embodiment includes a light unit 700, a display panel 500 that is disposed on the light unit 700, and a color conversion panel 300 that is disposed on the display panel 500. That is, the display panel 500 may be disposed between the color conversion panel 300 and the light unit 700. The light unit 700 is the same as the light unit 700 of FIG. 5 to FIG. 7, and therefore no further description of this element is made here.

FIG. 10 shows a 2×2 pixel portion, which is a part of a plurality of pixels that respectively correspond to a plurality of microcavities 305 (refer to FIG. 11), and such a pixel format may be successively or repeatedly arranged in the display device according to the present exemplary embodiment.

First, the display panel 500 will be described. The display panel 500 includes a first polarization layer 12 that is disposed between a first substrate 110 and the light unit 700, and a second polarization layer 22 that is disposed between an overcoat 390 and a color conversion panel 300. The first polarization layer 12 and the second polarization layer 22 polarize light incident from the light unit 700.

The first and second polarization layers 12 and 22 may be one or more of a coating-type polarization layer and a wire grid polarization layer.

Referring to FIG. 10 and FIG. 11, a gate line 121 extending along a first direction is disposed on the first substrate 110, and the gate line 121 includes a gate electrode 124.

A gate insulation layer 140 is disposed between the gate line 121 and the liquid crystal layer 3. A semiconductor layer 154 is disposed in one side of the gate insulation layer 140.

A data line 171 is disposed between the semiconductor layer 154 and the liquid crystal layer 3, and extends along a second direction and thus crosses the gate line 121. The data line 171 includes a source electrode 173, and a drain electrode 175 that is separated from the data line 171. The gate electrode 124, the source electrode 173, and the drain electrode 175 form a thin film transistor Q together with the semiconductor layer 154.

A first passivation layer 180a may be disposed between the thin film transistor Q and the liquid crystal layer 3. A light blocking member 220 and a second passivation layer 180b may be disposed on the first passivation layer 180a.

The first and second passivation layers 180a and 180b and the light blocking member 220 include a contact hole 185 that exposes the drain electrode 175.

A first electrode 191 is disposed between the second passivation layer 180b and the liquid crystal layer 3. The first electrode 191 may be a pixel electrode. The first electrode 191 may include a protruding portion 197 that protrudes toward the thin film transistor Q, and the protruding portion 197 may be physically and electrically connected with the drain electrode 175 through the contact hole 185. However, a structure of the thin film transistor and a design of the first electrode 191 are not limited to the structure and design described in the present exemplary embodiment, and they may be variously modified.

A first alignment layer 11 is disposed between the first electrode 191 and the liquid crystal layer 3, and a second alignment layer 21 is disposed to overlap the first alignment layer 11. In the present exemplary embodiment, the first alignment layer 11 and the second alignment layer 21 are distinguished according to their positions, and they may be connected to each other as shown in FIG. 11, to form a single continuous layer.

The microcavities 305 are disposed between the first alignment layer 11 and the second alignment layer 21, and liquid crystal molecules 31 are injected into the microcavities 305 to form the liquid crystal layer 3. The microcavities 305 may be disposed in plural along a matrix direction.

A second electrode 270 and a third passivation layer 345 are disposed on the second alignment layer 21. The second electrode 270 may be a common electrode. However, in another exemplary embodiment, the second electrode 270 may be disposed below the microcavities 305 to enable liquid crystal driving according to a coplanar electrode (CE) mode.

A roof layer 360 is disposed on the third passivation layer 345. The roof layer 360 supports the microcavity 305, which is a space between the first electrode 191 and the second electrode 270, and partially protrudes toward the first substrate 110 such that a partitioning wall portion PWP is formed. A fourth passivation layer 380 is disposed on the roof layer 360, but this may be omitted depending on an exemplary embodiment.

An overcoat 390 is disposed on the fourth passivation layer 380. In the present exemplary embodiment, the overcoat 390 may be disposed not only on the fourth passivation layer 380 but also in a liquid crystal inlet 307FP. The second polarization layer 22 is disposed on the overcoat 390. The color conversion panel 300 is disposed on the second polarization layer 22.

The color conversion panel 300 includes a substrate 310, color conversion layers 330R and 330G, a transmission layer 330B, a light blocking layer 320, and a planarization layer 350. The color conversion panel 300 is substantially the same as the above-described color conversion panel 300. A detailed description of the same constituent elements is thus omitted. That is, the color conversion layers 330G and 330R of the color conversion panel 300 may be as shown in one of the exemplary embodiments of FIG. 1 to FIG. 4, and the color conversion panel 300 may be the same as the color conversion panels 300 of FIG. 7 to FIG. 9.

As described, the display device according to the exemplary embodiments of the present invention includes the color conversion panel, where the color conversion layers of the color conversion panel include the first color conversion layer and the second color conversion layer, and light emitted from the first color conversion layer has a shorter wavelength than light emitted from the second color conversion layer. Thus, reabsorption of light in the color conversion layer can be prevented, thereby improving color conversion efficiency.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

| <Description of symbols> | |
|---|---|
| 300: color conversion panel | 320: light blocking layer |
| 330G: green color conversion layer | 330R: red conversion layer |
| 330B: transmission layer | 360: roof layer |
| 305: microcavity | 220: light blocking member |
| 121: gate line | 171: data line |
| 154: semiconductor layer | |

What is claimed is:

1. A color conversion panel comprising:
a substrate; and
a plurality of color conversion layers and a transmission layer that are disposed on the substrate, the plurality of color conversion layers comprising nanocrystals,
wherein at least one color conversion layer of the plurality of color conversion layers comprises a first color conversion layer and a second color conversion layer,
wherein the first color conversion layer is disposed between the substrate and the second color conversion layer, and
wherein the first and second color conversion layers are configured so that a wavelength of light color-converted in the first color conversion layer is shorter than a wavelength of light color-converted in the second color conversion layer,
wherein the first color conversion layer and the second color conversion layer are green color conversion layers or
wherein the first color conversion layer and the second color conversion layer are red conversion layers.

2. The color conversion panel of claim 1, wherein the size of a first nanocrystal included in the first color conversion layer is smaller than the size of a second nanocrystal included in the second color conversion layer.

3. The color conversion panel of claim 1, wherein the size of a first nanocrystal included in the first color conversion layer is 70% to 100% of the size of a second nanocrystal included in the second color conversion layer.

4. The color conversion panel of claim 2, wherein the size of the first nanocrystal is 2 nm to 14 nm, and the size of the second nanocrystal is 4 nm to 16 nm.

5. The color conversion panel of claim 1, wherein the first color conversion layer comprises first nanocrystals, the second color conversion layer comprises second nanocrystals, and the first nanocrystals comprise the same material as the second nanocrystals.

6. The color conversion panel of claim 1, wherein the first color conversion layer comprises first nanocrystals, the second color conversion layer comprises second nanocrystals, and first nanocrystals comprise different materials from those of the second nanocrystals.

7. The color conversion panel of claim 1, the wavelength of light color-converted in the first color conversion layer is 520 nm to 539 nm, and the wavelength of light color-converted in the second color conversion layer is 540 nm to 550 nm.

8. The color conversion panel of claim 1, wherein the first color conversion layer and the second color conversion layer are red conversion layers, the wavelength of light color-converted in the first color conversion layer is 610 nm to 629 nm, and the wavelength of light color-converted in the second color conversion layer is 630 nm to 650 nm.

9. The color conversion panel of claim 1, wherein:
the plurality of color conversion layers comprises a green color conversion layer and a red color conversion layer, the green color conversion layer comprises a first green color conversion layer and a second green color conversion layer, the first and second green color conversion layers are configured so that a wavelength of light color-converted in the first green color conversion layer is shorter than a wavelength of light color-converted in the second green color conversion layer, the red color conversion layer comprises a first red color conversion layer and a second red color conversion layer, and the first and second red color conversion layers are configured so that a wavelength of light color-converted in the first red color conversion layer is shorter than a wavelength of light color-converted in the second red color conversion layer.

10. The color conversion panel of claim 1, further comprising a color filter that is disposed between the plurality of color conversion layers and the substrate.

11. A display device comprising:
a display panel; and
a color conversion panel that is disposed on the display panel,
wherein the color conversion panel comprises:
a substrate, and
a plurality of color conversion layers and a transmission layer that are disposed between the substrate and the display panel, the plurality of color conversion layers comprising nanocrystals,
at least one color conversion layer of the plurality of color conversion layers comprises a first color conversion layer and a second color conversion layer,
the first color conversion layer is disposed between the substrate and the second color conversion layer, and
the first and second color conversion layers are configured so that a wavelength of light color-converted in the first color conversion layer is shorter than a wavelength of light color-converted in the second color conversion layer,
wherein the first color conversion layer and the second color conversion layer are green color conversion layers or
wherein the first color conversion layer and the second color conversion layer are red conversion layers.

12. The display device of claim 11, wherein the size of a first nanocrystal included in the first color conversion layer is smaller than the size of a second nanocrystal included in the second color conversion layer.

13. The display device of claim 11, wherein the first color conversion layer and the second color conversion layer are green color conversion layers, the wavelength of light color-converted in the first color conversion layer is 520 nm to 539 nm, and the wavelength of light color-converted in the second color conversion layer is 540 nm to 550 nm.

14. The display device of claim 11, wherein the first color conversion layer and the second color conversion layer are red color conversion layers, the wavelength of light color-converted in the first color conversion layer is 610 nm to 629 nm, and the wavelength of light color-converted in the second color conversion layer is 630 nm to 650 nm.

15. The display device of claim 11, wherein:
the plurality of color conversion layers comprises a green color conversion layer and a red color conversion layer,
the green color conversion layer comprises a first green color conversion layer and a second green color conversion layer,
the first and second green color conversion layers are configured so that a wavelength of light color-converted in the first green color conversion layer is shorter than a wavelength of light color-converted in the second green color conversion layer,
the red color conversion layer comprises a first red color conversion layer and a second red color conversion layer, and
the first and second red color conversion layers are configured so that a wavelength of light color-converted in the first red color conversion layer is shorter than a wavelength of light color-converted in the second red color conversion layer.

16. The display device of claim 11, wherein the display panel comprises:
a first substrate;
a roof layer that overlaps the first substrate; and
a plurality of microcavities that are disposed between the first substrate and the roof layer and that include liquid crystal molecules.

17. The display device of claim 16, wherein the roof layer comprises a protrusion that extends toward the first substrate, and the protrusion is disposed between two of the microcavities.

18. The display device of claim 11, wherein the display panel comprises:
a first substrate that includes a first electrode;
a second substrate that overlaps the first substrate and includes a second electrode; and
a liquid crystal layer that is disposed between the first substrate and the second substrate.

* * * * *